United States Patent
Grenouillet et al.

(10) Patent No.: US 9,437,474 B2
(45) Date of Patent: Sep. 6, 2016

(54) METHOD FOR FABRICATING MICROELECTRONIC DEVICES WITH ISOLATION TRENCHES PARTIALLY FORMED UNDER ACTIVE REGIONS

(75) Inventors: Laurent Grenouillet, Rives sur Fure (FR); Yannick Le Tiec, Crolles (FR); Nicolas Loubet, Guilderland, NY (US); Maud Vinet, Rives sur Fure (FR); Romain Wacquez, Marseilles (FR)

(73) Assignee: Commissariat à l'énergie atomique et aux énergies alternative, Paris (FR)

( * ) Notice: Subject to any disclaimer, the term of this patent is extended or adjusted under 35 U.S.C. 154(b) by 0 days.

(21) Appl. No.: 14/425,891

(22) PCT Filed: Sep. 5, 2012

(86) PCT No.: PCT/US2012/053768
§ 371 (c)(1),
(2), (4) Date: Mar. 24, 2015

(87) PCT Pub. No.: WO2014/039034
PCT Pub. Date: Mar. 13, 2014

(65) Prior Publication Data
US 2015/0294903 A1    Oct. 15, 2015

(51) Int. Cl.
*H01L 21/76* (2006.01)
*H01L 21/762* (2006.01)
(Continued)

(52) U.S. Cl.
CPC ... *H01L 21/76283* (2013.01); *H01L 21/26506* (2013.01); *H01L 21/26586* (2013.01);
(Continued)

(58) Field of Classification Search
CPC .................. H01L 21/76232; H01L 21/76237; H01L 21/265
See application file for complete search history.

(56) References Cited

U.S. PATENT DOCUMENTS 8,445,356 B1 * 5/2013 Cai .................. H01L 21/76232
257/374
2005/0124102 A1 * 6/2005 Wang ................ H01L 21/76237
438/197

(Continued)

OTHER PUBLICATIONS

U.S. Appl. No. 14/425,977, filed Mar. 4, 2015, Vinet, et al.
(Continued)

*Primary Examiner* — Zandra Smith
*Assistant Examiner* — Evan Clinton
(74) *Attorney, Agent, or Firm* — Oblon, McClelland, Maier & Neustadt, L.L.P.

(57) ABSTRACT

A method of producing a microelectronic device in a substrate comprising a first semiconductor layer, a dielectric layer and a second semiconductor layer, comprising the following steps: etching a trench through the first semiconductor layer, the dielectric layer and a part of the thickness of the second semiconductor layer, thus defining, in the first semiconductor layer, one active region of the microelectronic device, ionic implantation in one or more side walls of the trench, at the level of the second semiconductor layer, modifying the crystallographic properties and/or the chemical properties of the implanted semiconductor, etching of the implanted semiconductor such that at least a part of the trench extends under a part of the active region, —filling of the trench with a dielectric material, forming an isolation trench surrounding the active region and comprising portions extending under a part of the active region.

12 Claims, 6 Drawing Sheets

(51) Int. Cl.
*H01L 21/84* (2006.01)
*H01L 21/3065* (2006.01)
*H01L 21/308* (2006.01)
*H01L 21/265* (2006.01)
*H01L 21/306* (2006.01)

(52) U.S. Cl.
CPC ....... *H01L21/3065* (2013.01); *H01L 21/3086* (2013.01); *H01L 21/30604* (2013.01); *H01L 21/76224* (2013.01); *H01L 21/76232* (2013.01); *H01L 21/84* (2013.01)

(56) References Cited

U.S. PATENT DOCUMENTS

| | | | |
|---|---|---|---|
| 2007/0278183 A1* | 12/2007 | Lee | H01L 21/30608 216/83 |
| 2009/0162991 A1 | 6/2009 | Beneyton et al. | |
| 2009/0170331 A1 | 7/2009 | Cheng et al. | |
| 2009/0289291 A1 | 11/2009 | Cheng et al. | |
| 2011/0193193 A1* | 8/2011 | Dube | H01L 21/76229 257/532 |
| 2013/0341649 A1 | 12/2013 | Le Tiec et al. | |
| 2014/0061798 A1 | 3/2014 | Vinet et al. | |
| 2014/0322767 A1 | 10/2014 | Marchand et al. | |
| 2015/0044841 A1 | 2/2015 | Batude et al. | |
| 2015/0056734 A1 | 2/2015 | Grenouillet et al. | |

OTHER PUBLICATIONS

U.S. Appl. No. 14/791,713, filed Jul. 6, 2015, Reboh, et al.
"International Business Machines Corporation; Patent Issued for Method of Fabricating a Deep Trench (DT) Metal-Insulator (MIM) Capacitor", Journal of Engineering, (Aug. 29, 2012), (Total 5 Pages).
Written Opinion of the International Searching Authority Issued Nov. 15, 2012 in PCT/US12/53768 Filed Sep. 5, 2012.
International Search Report Issued Nov. 15, 2012 in PCT/US12/53768 Filed Sep. 5, 2012.
U.S. Appl. No. 14/441,354, filed May 7, 2015, Vinet, et al.
U.S. Appl. No. 14/719,580, filed May 22, 2015, Grenouillet, et al.

* cited by examiner

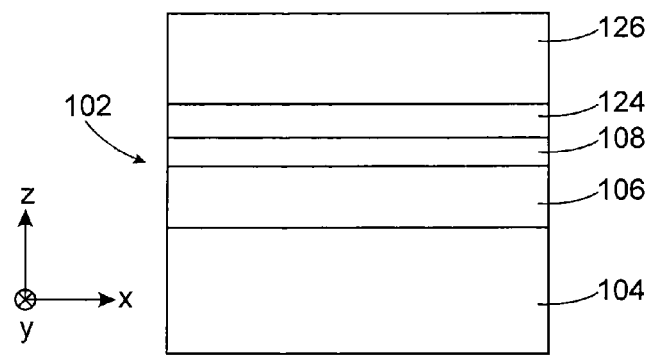
FIG.8
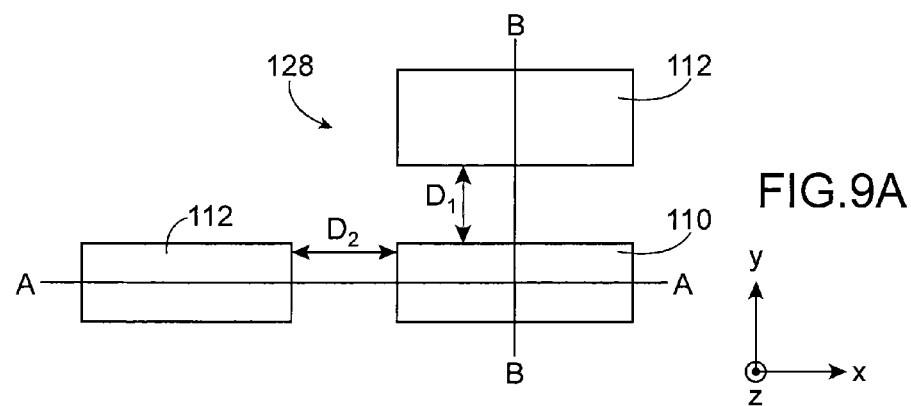
FIG.9A
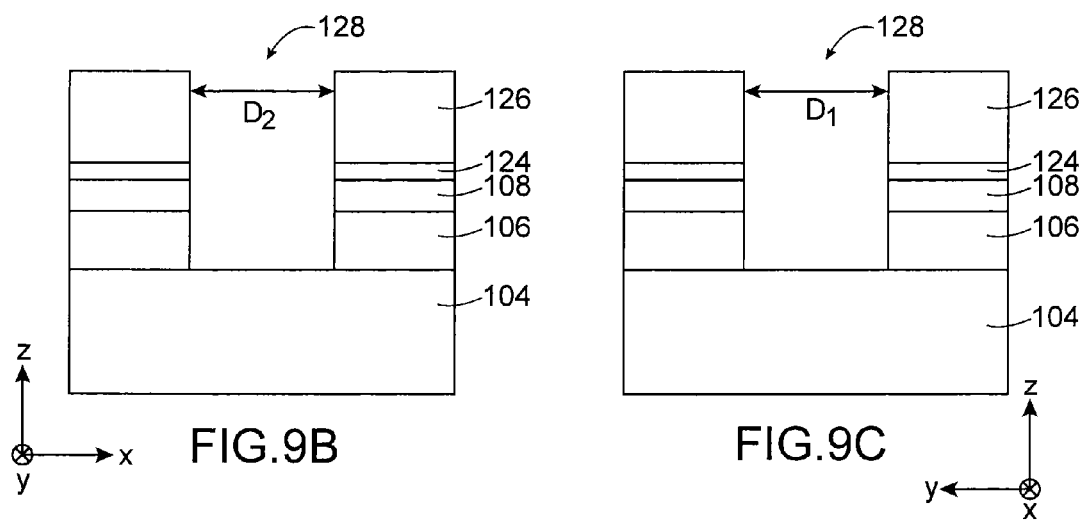
FIG.9B
FIG.9C

METHOD FOR FABRICATING MICROELECTRONIC DEVICES WITH ISOLATION TRENCHES PARTIALLY FORMED UNDER ACTIVE REGIONS

TECHNICAL FIELD

The invention relates to microelectronic devices fabricated with a semiconductor on insulator type substrate (SOI) and having active regions, or areas or zones, delimited by isolation trenches, for example of STI type ("Shallow Trench Isolation"). The invention is advantageously used for the production of FDSOI transistors (Fully-Depleted SOI) made with UTBB technology ("Ultra-Thin Body and Box").

BACKGROUND OF THE INVENTION

The fabrication of microelectronic devices, such as transistors, in a SOI substrate comprises the realization of insulation trenches, for example of the STI type, that allow an electrical isolation of the active regions of the devices, made in the same SOI substrate, from each other.

The pattern of the isolation trenches made in the substrate is complementary to that of the active regions of the devices. An example of an isolation trench 8 of the STI type is shown in FIG. 1. This trench 8 is made in an SOI substrate 1 comprising a support layer 2, or thick layer, composed of semiconductor (typically of silicon) coated with a dielectric thin layer 4 called BOX (Burried OXide) and a thin layer 6, or surface layer, composed of semiconductor, here of silicon, and wherein the active regions of the devices are intended to be made. The isolation trench 8 bounds here two active regions 10a and 10b of two transistors made in the semiconductor thin layer 6. The isolation trench 8, composed of a dielectric material such as $SiO_2$, is made through the entire thicknesses of the semiconductor thin layer 6 and of the dielectric thin layer 4, and a part of the thickness of the support layer 2.

During the fabrication of the microelectronic devices in the substrate 1, after forming the isolation trench 8, the substrate 1 usually undergoes several steps of cleaning and etching which can damage the insulation trench 8, such as cleaning steps performed with a hydrofluoric acid solution and after a gate etching or prior to silicidation or epitaxy steps. The semiconductor oxide of the isolation trench 8 is attacked by these steps and partially removed, both vertically and horizontally (see FIG. 2 onto which the dielectric material of the isolation trench 8 is partially withdrawn). Such degradations of the isolation trench 8 can lead to problems of electrical insulation between the support layer 2 and the thin layer 6, especially during the subsequent realization of electrical contacts in the vicinity of the isolation trench 8. In the example shown on FIG. 3, one of the electrical contacts 12 is intended to electrically contact a portion of the active region 10b near the isolation trench 8, this portion corresponding for example to a source or drain region of a transistor made in the active region 10b. However, in current technology nodes, given the short distance between two active regions (equal to about 50 nm in the 20 nm-node technology) which corresponds to the width of the isolation trench, a slight misalignment during the lithography made to form the electrical contact 12 can cause a shift of this electrical contact 12 on the isolation trench 8. Such a shift can also be intentional, some electrical contacts being made voluntarily overflowing on the isolation trench 8. However, given the partial withdrawal of $SiO_2$ of the isolation trench 8, this offset can lead to a short circuit between the active region 10b formed in the semiconductor thin layer 6 and the semiconductor of the support layer 2 (on the example of FIG. 3, a part of the electrical contact 12 is placed in a recess formed by the partial removal of the dielectric material of the isolation trench 8, thus short-circuiting the thin layer 6 with the support layer 2).

To solve this problem of degradation of the insulation trenches, a solution shown in FIG. 4 is, when performing an isolation trench 15, first to cover the walls (side walls and bottom wall) of the trench with a thin layer 14 (a liner) composed of a dielectric material more resistant than the semiconductor oxide used to make the isolation trench 8, for example silicon nitride. The remaining space of the trench is then filled with a semiconductor oxide 16, like $SiO_2$.

The parts of the SiN layer 14 forming the side walls of the isolation trench 15 strengthen the resistance of the isolation trench 15 towards the steps of cleaning and etching.

However, although this solution partially avoids degrading the isolation trench during the steps of cleaning and etching, it does not completely eliminate the risk of short circuit described above. Indeed, during the etching of the electrical contacts, it is necessary to etch a thin nitride layer (called "contact etch stop layer"), which will result in the simultaneous etching of the nitride layer 14 and thus destroy the sealing made by the nitride layer 14. In addition, when the layer 14 is composed of a high permittivity dielectric, electrical performance degradations are observed as a result of an oxygen diffusion occurring through the liner.

BRIEF DESCRIPTION OF THE INVENTION

One aim of the present invention is to provide a method of producing a microelectronic device comprising at least one active region delimited by an isolation trench that is resistant towards of steps which can degrade the material(s) of the isolation trench, which avoids short circuits in the substrate even in case of partial withdrawal of the material(s) of the trench isolation, and which enables to obtain a bottling process not limited by the dimensions and the shape of the isolation trench.

For this, the present invention proposes a method of producing a microelectronic device in a substrate comprising a first semiconductor layer disposed on a dielectric layer, the dielectric layer being disposed on a second semiconductor layer, comprising at least the following steps:

etching a trench through the first semiconductor layer, the dielectric layer and a part of the thickness of the second semiconductor layer, thus defining, in the first semiconductor layer, at least one active region of the microelectronic device, ionic implantation in one or more side walls of the trench, at the level of the second semiconductor layer, modifying the crystallographic properties, or the chemical properties, or both the crystallographic properties and the chemical properties, of the implanted semiconductor, etching of the implanted semiconductor such that at least a part of the trench extends under a part of the active region, filling of the trench with a dielectric material, forming an isolation trench surrounding the active region and comprising portions extending under a part of the active region.

Thus, the isolation trench comprises, at the level of the support layer of the substrate, that is the second semiconductor layer, one or more dielectric regions thicker than the rest of the isolation trench and which extend under the active region, for example where there is a risk of short circuit and/or where the thickness of the dielectric material of the isolation trench has no or little impact on the electrical characteristics of the semiconductor device, for example under the regions of source and drain of a transistor which may correspond to the microelectronic device. In the event of partial withdrawal of a part of the dielectric material of the isolation trench, the thicker dielectric regions ensure an electrical insulation of the second semiconductor layer towards of one or more electrical contacts which may extend beyond over the isolation trench.

Such isolation trench therefore comprises one or more side walls which, at the level of the second semiconductor layer, are not vertically aligned with the active region bounded by the isolation trench.

The use of the ionic implantation in order to modify the crystallographic properties of the semiconductor (crystalline vs. amorphous) and/or the chemical properties (semiconductor vs. compound comprising this semiconductor) to obtain an etching selectivity of this implanted semiconductor in view of the rest of the semiconductor of the thick layer. This method also enables to obtain a bottling process, that is a local enlargement of the dielectric of the isolation trench at the level of the second semiconductor layer, which does not depend on the loading factor, i.e. which does not depend on the density of the design realized in the silicon wafer.

The portions of the isolation trench which extend under the part of the active region may be in contact with a portion of the dielectric layer disposed under the active region.

The semiconductor of the second semiconductor layer may be crystalline, and the ionic implantation in said one or more side walls of the trench may be such that the implanted semiconductor become amorphous.

The ionic implantation in said one or more side walls of the trench may be such that the implanted semiconductor become a compound of said semiconductor and of the implanted ionic species.

The etching of the implanted semiconductor may be made using HCl as etching agent.

The ionic implantation may be carried out with at least one ion beam having an energy of between about 0.5 keV and 40 keV, and/or a dose between about $5 \cdot 10^{13}$ and $5 \cdot 10^{16}$ at·cm$^{-2}$, and/or oriented such that an angle between said one or more side walls of the trench and the ion beam is between around 5° and 25°. The energy of the ion beam may be preferably between about 0.5 keV and 10 keV to avoid significant changes of physical properties of the first semiconductor layer. Using ion beams with low energy and moderate dose reduces the risk of defects and dislocations in the implanted semiconductor. In addition, the implantation may be carried out in only one direction so that only a part of the side walls of the isolation trench extends under the active region.

The ionic implantation may also be performed in a bottom wall of the trench.

The method may further comprises, between the step of etching the trench and the step of ionic implantation, a step of producing at least one dielectric layer forming side walls of the isolation trench against the dielectric layer and the first semiconductor layer. Such a liner may form the upper part of the side walls of the isolation trench.

The active region may be substantially rectangular in shape and bounded by at least four side walls of the isolation trench extending through the first semiconductor layer, the dielectric layer and said part of the thickness of the second semiconductor layer, and wherein, at the level of said part of the second semiconductor layer conductor, two of the four side walls which are substantially parallel with respect to each other extend under a part of the active region and the two other side walls do not extend under the active region. Thus, such isolation trench comprises an asymmetrical profile such that at the level of the second semiconductor layer (that is the support layer of the substrate), the two side walls which extend under the active region avoid short circuits in the substrate even in the case of partial withdrawal of the materials of the isolation trench.

In this case, the method may further comprise, after the step of filling of the trench, a step of producing at least one transistor in the active region, the transistor comprising a gate made on a part of the active region and on a part of said two other side walls. The side walls which are oriented substantially perpendicular to the gate may correspond to those which do not extend under the active region (and in particular under the channel region of the transistor), and which are aligned vertically with the active region so as to not reduce the size of the ground plane of the transistor, and therefore does not shift the threshold voltage of the transistor from its nominal value. Moreover, this configuration also limits the degradation of short channel effects because the thickness of the dielectric which is buried under the channel is not changed.

The active region may be substantially rectangular in shape and bounded by side walls of the isolation trench extending through the first semiconductor layer, the dielectric layer and said part of the thickness of the second semiconductor layer, and wherein, at the level of said part of the second semiconductor layer conductor, the side walls extend under a part of the active region. In this variant, at the level of the second layer of semiconductor, all side walls of the isolation trench may extend beyond under the active region, and be in contact with a portion of the dielectric layer which is disposed under the active region. Thus, in this variant, at the level of the second semiconductor layer, none of the side walls of the isolation trench at the level of the second semiconductor layer is vertically aligned with the bounds of active region delimited by the part of the isolation trench at the level of the first semiconductor layer.

The method may further comprise, after the step of filling of the trench, a step of producing at least one transistor in the active region, the transistor comprising a gate made on a part of the active region.

BRIEF DESCRIPTION OF THE DRAWINGS

The present invention will be better understood upon reading the description of embodiments given purely indicative and in no way limiting with reference to the accompanying drawings, in which:

FIGS. 8 to 15B show steps of a method of producing a microelectronic device according to the first embodiment of the invention.

Identical, similar or equivalent parts of the different figures described hereinafter bear the same numerical references so as to facilitate the transition from one figure to another.

The different parts illustrated in the figures are not necessarily shown using a uniform scale, to make the figures more legible.

The different possibilities (alternatives and embodiments) must be understood as not being mutually exclusive and may be combined with one another.

DETAILED DESCRIPTION OF SPECIFIC EMBODIMENTS

Figure 1:
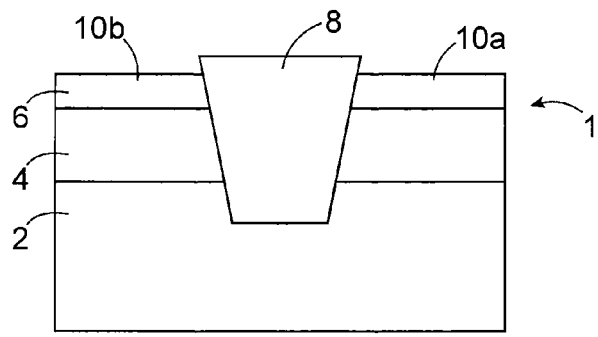
FIGS. 1 to 4 show isolation trenches according to prior art.
Figure 2:
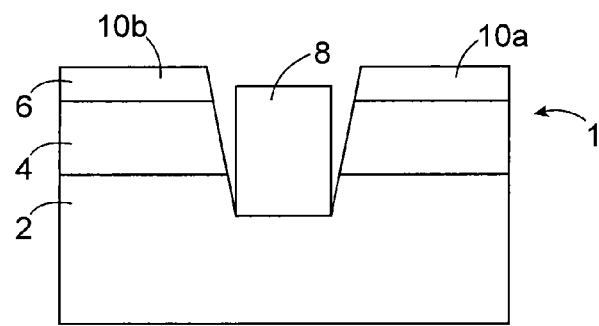
Figure 3:
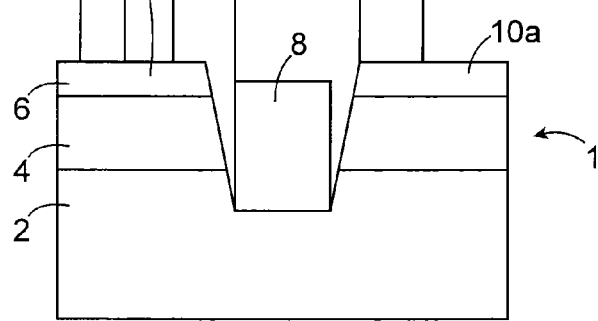
Figure 4:
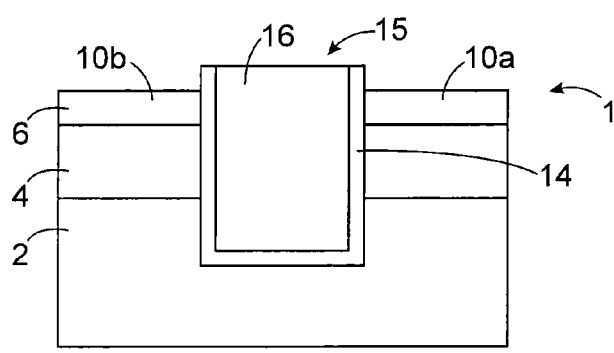
Figure 5:
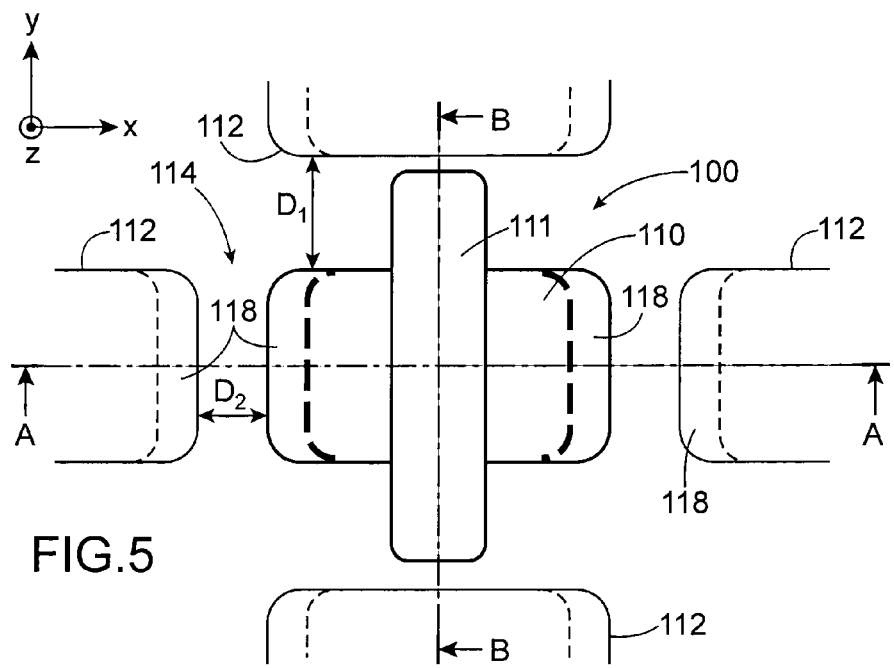
FIGS. 5 to 7 show a microelectronic device produced with a method according to a first embodiment of the invention.
Figure 6:
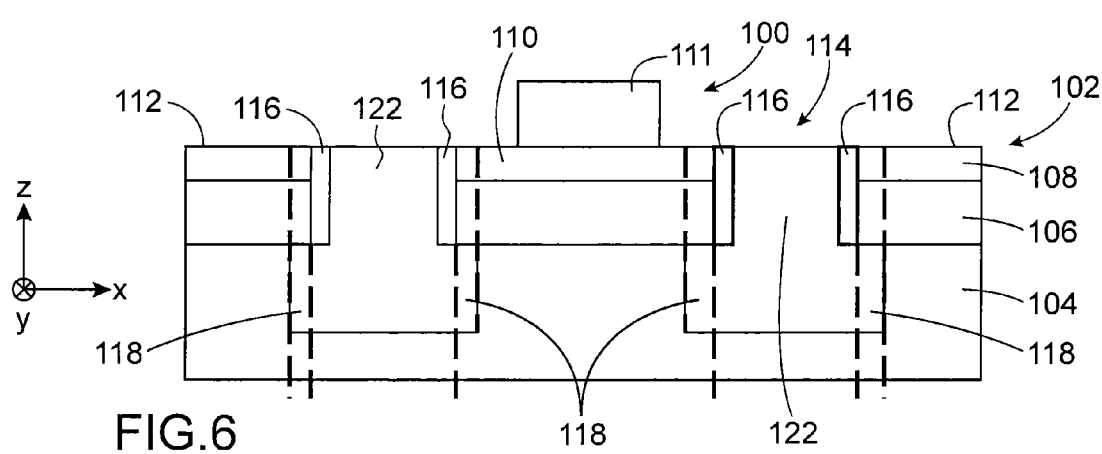
Figure 7:
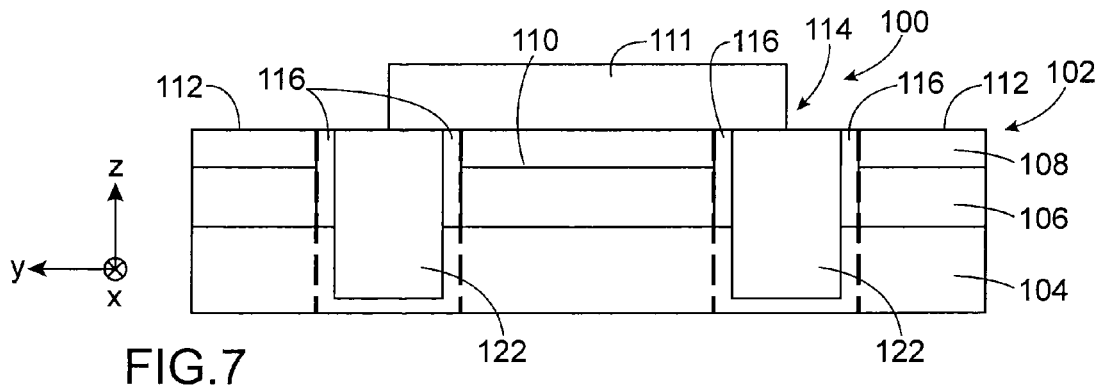

Referring first to FIGS. 5-7 which show schematically a microelectronic device 100, here a FDSOI transistor of the UTBB type, produced with a method according to a first embodiment which will be further described. FIG. 5 is a top view of the transistor 100, and FIGS. 6 and 7 are cross-sectional views respectively along lines AA and BB shown in FIG. 5.

The transistor 100 is produced in a substrate 102 of SOI type comprising a support layer 104, or thick layer, composed of semiconductor, for example composed of silicon, a dielectric thin layer 106 (BOX), for example composed of $SiO_2$, and a thin layer 108, or surface layer, composed of semiconductor, here silicon. A region of the semiconductor thin layer 108 forms an active region 110 of the transistor 100 comprising a channel, a source region and a drain region of the transistor 100. A gate 111 of the transistor 100 is formed on the active region 110.

Other active regions 112 of different devices are also made in the substrate 102 and shown in FIGS. 5-7. The active region 110 is isolated from the other active regions 112 by an isolation trench 114 the design of which being complementary to that of all the active regions made in the substrate 102. The distance between two active regions (corresponding to the distances $D_1$ and $D_2$ shown in FIG. 5) corresponds to the width of the isolation trench 114, and is for example between about 40 nm and 1 µm. For microelectronic devices made with 20 nm-node technology, the width of the isolation trench 114 is for example between about 40 nm and 200 nm. The isolation trench 114 bounds the active region 110.

The isolation trench 114 is made through the entire thickness of the semiconductor thin layer 108 and of the dielectric thin layer 106, and through a part of the thickness of the semiconductor support layer 104. At the level of the semiconductor thin layer 108 and of the dielectric thin layer 106, the side walls of the isolation trench 114 are formed by a dielectric layer 116 composed of nitride semiconductor, here SiN, or a bilayer of SiN/SiO2, or a high-k dielectric (with a permittivity greater than about 3.9) such as $HfO_2$ or HfSiON. This dielectric layer 116, whose thickness is for example between about 5 nm and nm, in particular allows to prevent, during the realization of the isolation trench 114 which will be described below, a ionic implantation in the semiconductor of the thin layer 108. For reasons of clarity of the drawings, the layer 116 is not visible in FIG. 5.

At the level of the support layer 104, the side walls of the isolation trench 114 are formed by portions of dielectric material, here $SiO_2$, whose thickness varies depending on the orientation of these walls towards the gate 111 of the transistor 100. Indeed, around the active region 110 which is rectangular in shape, the isolation trench 114 has four side walls which are parallel in pairs. At the level of the side walls of the isolation trench 114 which are not covered by the gate 111, that is to say that do not cross the gate 111 (these side walls being oriented parallel to the grid 111 which spreads along a direction corresponding to the Y axis in FIGS. 5 to 7, that is the grid has main sides parallel to this direction which corresponds to the Y axis), dielectric portions 118 which have a thickness (dimension along the X axis) between about 5 nm and 10 nm form the side walls of the isolation trench 114 in the semiconductor support layer 104 under active regions 110, 112. According to other variants, the thickness of the dielectric portions 118 may be between about 5 nm and 50 nm. These portions 118 are arranged under the active region 110 (see FIG. 6). The portions 118 are in contact with the part of the dielectric layer 106 located under the active region 110. The portions of dielectric material 118 forming two side walls of the isolation trench 114 are represented symbolically in broken lines in FIG. 5.

The remainder of the isolation trench 114 is filled with a dielectric material 122, such as $SiO_2$. Thus, at the level of the side walls of the trench which are oriented perpendicularly to the gate 111, the dielectric material 122 form the side walls of the isolation trench 114 at the level of the support layer 104 of semiconductor and is not arranged under the active region 110.

A method for producing the microelectronic device 100, here a transistor FDSOI, according to the first embodiment is now described in relation with FIGS. 8-15.

The transistor 100 is made from a standard pre-STI stack comprising the SOI substrate 102 onto which are stacked an oxide layer (e.g. $SiO_2$) 124 and a nitride layer (here SiN) 126. The layers of this stack shown in FIG. 8 have here the following thicknesses:

nitride layer 126: 80 nm, or between around 50 nm and 100 nm, oxide layer 124: 10 nm, or between around 3 nm and 10 nm, thin layer of silicon 108: 7 nm, thin dielectric layer 106: 25 nm, thick silicon layer 104: 700 µm.

The thicknesses given above are given as an indication for a transistor 100 manufactured using the 20 nm-node UTBB technology. However, these thicknesses may vary, according to the implementation options considered and also the technology node with which the device is made.

A trench 128, whose design is complementary to that of the active regions to achieve in the substrate, is etched through the nitride layer 126, the oxide layer 124, the thin layer of semiconductor 108 and the thin dielectric layer 106 (but not through the thick layer 104). In the example of FIGS. 9A to 9C (FIGS. 9B and 9C are cross-sectional views respectively along the lines AA and BB shown in FIG. 9A), the active region 110 of the transistor 100 is spaced from the other active regions 112 of a distance $D_1$ or $D_2$ between about 40 nm and 50 nm, corresponding to the width of the trench 128. This etching may correspond to an anisotropic etch with a stop at the level of the interface between the support layer 104 and the thin dielectric layer 106.

Figure 10A:
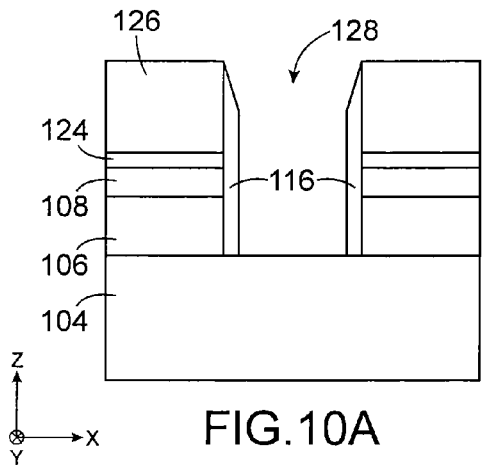
Figure 10B:
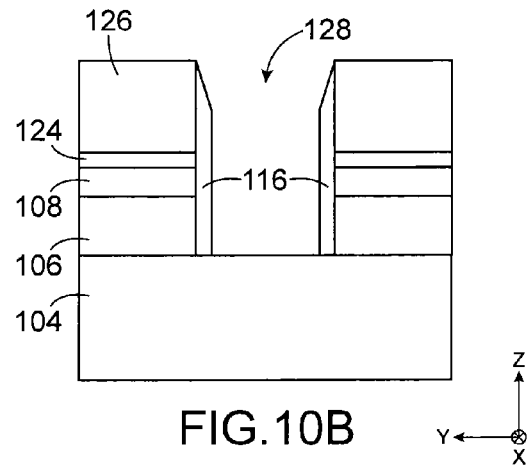

The side walls of the trench 128 are then protected with the dielectric layer 116 composed for example of nitride semiconductor, here SiN, and produced against the side walls of the trench 128 (see FIGS. 10A and 10B). The dielectric layer 116 is formed as a spacer around the remaining portions of the layers 126, 124, 108 and 106, that is against the side walls of the layers 126, 124, 108 and 106 located inside the trench 128. The thickness of the dielectric layer 116 may be between around 3 nm and 15 nm for microelectronic devices made with 22 nm-node technology. The maximum thickness of the dielectric layer 116 depends on distance $D_1$ or $D_2$ which has to be respected according to the technology node with which the device is made. The dielectric layer 116 is produced with a conformal deposition of the dielectric material (that is a deposition with a regular thickness against the sidewalls of the trench 128 and also against the bottom walls of the trench 128 and on the nitride layer 126). An anisotropic etching, e.g. a RIE (Reactive Ion Etching), is then carried out in order to etch the portions of the dielectric material previously formed against the bottom walls of the trench 128 and on the nitride layer 126, thus forming the dielectric layer 116 as a spacer around the portions of layers 126, 124, 108 and 106.

According to another embodiment, the dielectric layer 116 may comprise a bilayer of $SiN/SiO_2$, or a high-k dielectric (with a permittivity greater than about 3.9) such as $HfO_2$ or HfSiON.

Figure 11A:
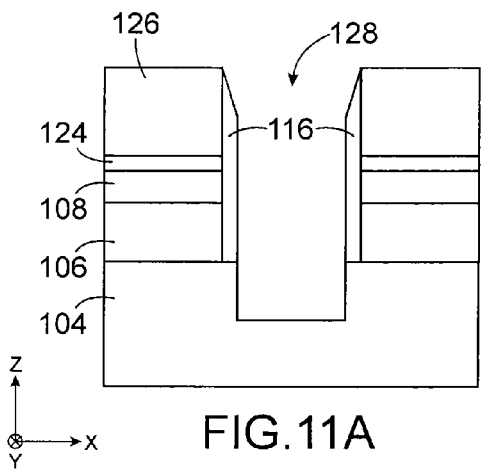
Figure 11B:
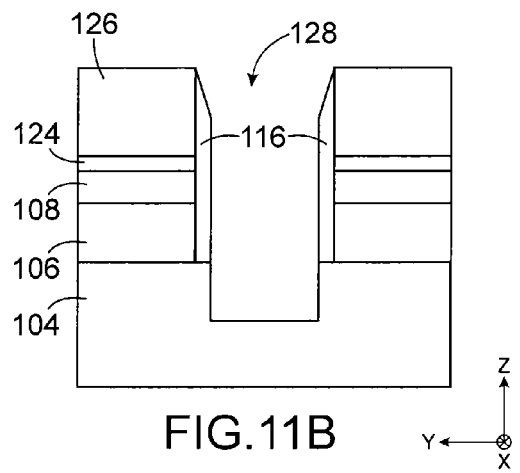

As shown in FIGS. 11A and 11B, the trench 128 is then extended through a part of the thickness of the semiconductor support layer 104. In the example described here, the total depth of the trench 128 (through the layers 126, 124, 108, 106 and 104) is for example equal to about 200 nm, and may be between 100 nm and 300 nm.

Figure 12A:
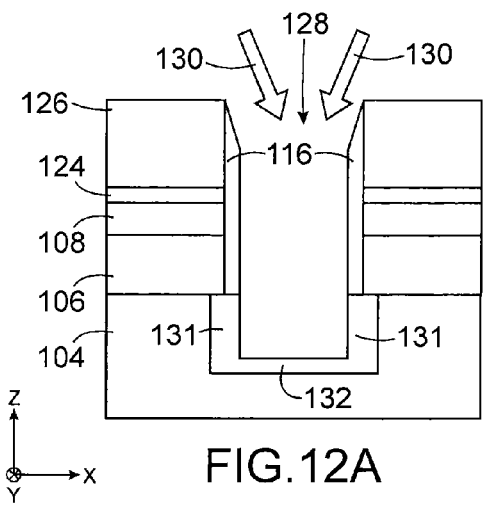
Figure 12B:
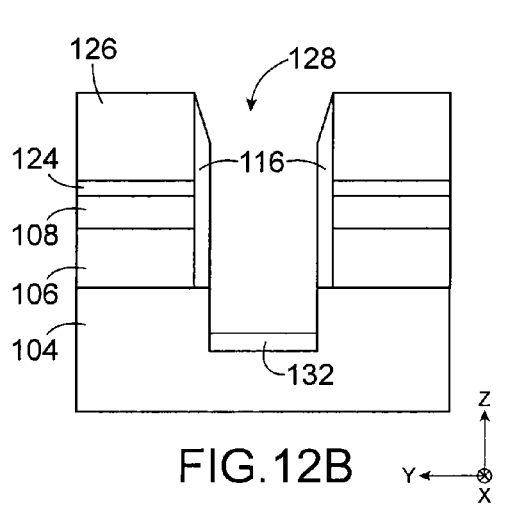

As shown in FIGS. 12A and 12B, an ionic implantation is then carried out in the semiconductor of the layer 104 exposed in the trench 128, that is in the walls of the layer 104 at the level of the trench 128. This ionic implantation is carried out in order to locally modify the crystallographic properties and/or the chemical properties of the semiconductor (here silicon) of the layer 104 exposed in the trench 128. This ionic implantation is implemented such that the crystallographic properties and/or the chemical properties of the semiconductor of the parts of the side walls of the trench 128 at the level of the thick layer 104 are transformed through a thickness which depends on the parameters of the ionic implantation. In the first embodiment described here, this implantation is performed only in the side walls which are parallel to the main dimension of the gate of the transistor 100, that is to say, extending parallel to the Y axis. Thus, as represented in FIG. 12A, portions 131 composed of semiconductor with modified crystallographic properties and/or chemical properties form these side walls. Such implantation is performed using ion beams 130 forming a zero angle with the plane (X, Z). Thus, the ion beam 130 does not perform a modification of the crystallographic properties and/or the chemical properties of the semiconductor at the level of the side walls of the trench 128 extending parallel to the axis X. The beams 130 form for example an angle equal to about 15° with the normal to the substrate 102 (that is to say an angle of about 15° with respect to the Z axis). The angle of beams 130 is adapted according to the depth of the trench 128 (e.g. 200 nm) and its lateral dimensions (width, e.g. 50 nm), and may be between about 5° and 30°.

Figure 13A:
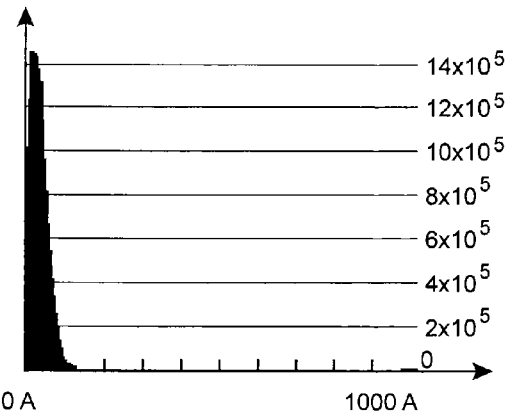
Figure 13B:
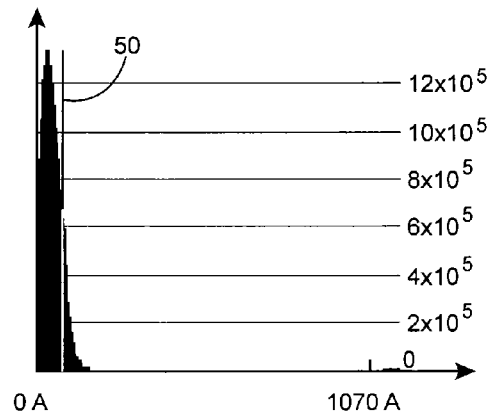

The dielectric layer 116 formed along the side walls of the trench 128, at the level of the layers 106, 108, 124 and 126 of the stack, protects these layers, and especially the thin silicon layer 108, against the beams 130, thereby preventing the ionic implantation in the silicon thin film 108. By way of illustration, FIGS. 13A and 13B show the concentration ratios at·$cm^{-3}$/at·$cm^{-2}$ obtained respectively in silicon (see FIG. 13A) and in silicon covered with a layer of SiN with a thickness equal to about 6 nm (see FIG. 13B), depending on the depth in the implanted materials. We see in FIG. 13B that silicon (the reference 50 corresponds to the limit SiN/Si) does not undergo almost the implantation performed.

All the bottom wall of the trench 128, that is also the bottom wall of the parts of the trench 128 extending parallel to the axis X, undergoes the ionic implantation in a similar manner to the side walls which extend parallel to the Y axis, at the level of the support layer of semiconductor 104. Thus portions 132 composed of semiconductor with modified crystallographic properties and/or modified chemical properties correspond to the bottom wall of the trench 128.

According to the nature of the ionic species which are implanted in the semiconductor, the crystallographic properties and/or the chemical properties of the semiconductor are modified. According to a first variant, it is possible to implant ionic species such that the implanted semiconductor becomes amorphous. In this case, ionic species, such as for example argon and/or nitrogen (or eventually ionic species like arsenic and/or phosphorus if a n-type ground plane is desired), are implanted in the semiconductor (in this case, the substrate 102 comprises initially a thick layer 104 composed of crystalline semiconductor, and especially monocrystalline semiconductor in case of CMOS transistor). After the implantation, these species don't change the doping of the semiconductor and don't form an alloy based on the implanted semiconductor. The dose of implanted ionic species is chosen such that the implanted semiconductor become amorphous semiconductor, e.g. more the $5 \cdot 10^{14}$ $cm^{-2}$. The table bellow gives the thickness (in nm) of the implanted semiconductor with beams of argon, with a tilt angle of 20°, for different values of the dose and of the energy of the beams, in silicon:

| Dose | Energy (keV) | | | | | |
|---|---|---|---|---|---|---|
| | 2 | | 4 | | 8 | |
| ($cm^{-2}$) | a/c | Rp | a/c | Rp | a/c | Rp |
| 5E+14 | 4.8 | 5.7 | 8.2 | 10.6 | 14.7 | 18.2 |
| 1E+15 | 5.7 | 5.3 | 10.1 | 9 | 18.1 | 15.3 |

The parameter "a/c" corresponds to the limit between amorphous/crystalline in the implanted semiconductor, that is corresponds to the lateral amorphization depth. The parameter "Rp" corresponds to the desired depth implantation.

Thus it is possible to chose the thickness of the implanted semiconductor (in FIG. 12A, this thickness corresponds to the dimension along the X axis for the lateral portions 131, and the dimension along the Z axis for the bottom portion 132) by modifying one or several of the following parameters: dose, energy, nature of the implanted ionic species, angle of the ionic beams.

According to a second variant, it is possible to implant ionic species in the semiconductor such that this implantation creates a new compound of the semiconductor and of the implanted species. For example, it is possible to implant germanium and/or carbon in the semiconductor such that the portions 131 and 132 are composed of a compound of this semiconductor and of the implanted species (e.g. composed of SiGe and/or SiC if the layer 104 is composed of silicon). Moreover, in this second variant, according to the implantation dose, it is possible that this implantation also modify the crystallographic properties of the implanted material, which may be amorphous if the semiconductor is initially crystalline. For example, an implantation of germanium in crystalline silicon, with an energy of between 4 keV and 10 keV, and a dose equal to around 1E+16 $cm^{-2}$ leads to an portion of amorphous SiGe with a thickness equal to around 10 nm.

During the ionic implantation, a small part of the semiconductor of the thin layer 108, at the level of the side walls of the trench 128 may become amorphous. However, this part of amorphous semiconductor will become again crystalline during a further annealing made during the process, as described further.

Figure 14A:
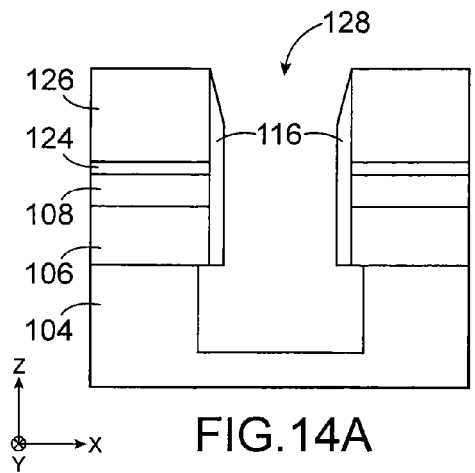
Figure 14B:
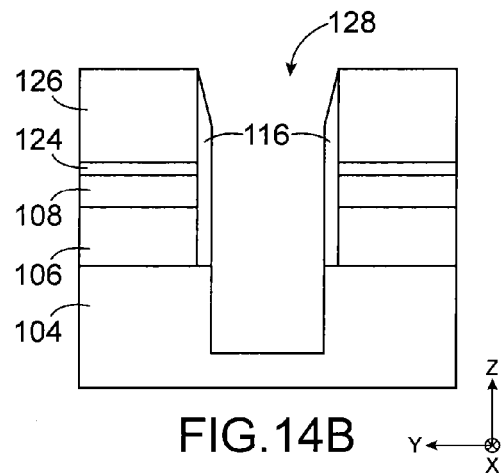
Figure 15A:
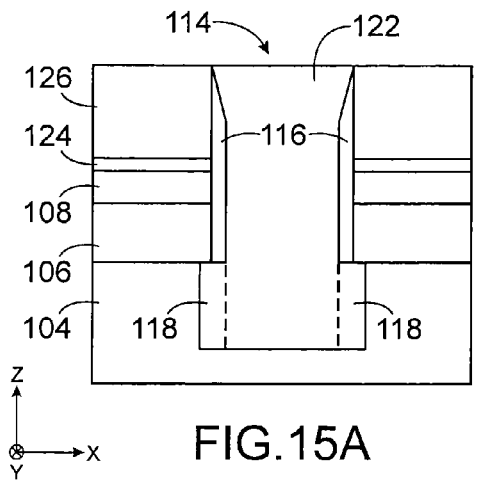
Figure 15B:
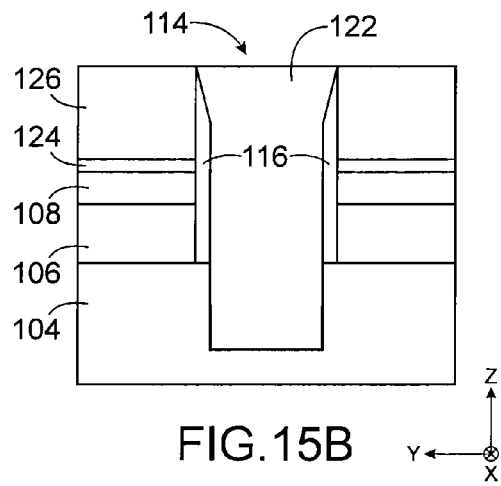

The portions 131 and 132 of semiconductor with modified crystallographic properties and/or modified chemical properties are then removed as shown in FIGS. 14A and 14B. This removing can correspond to a vapor phase etching, or gaseous phase etching, using HCl as etching agent. When the ionic implantation corresponds to an implantation of neutral species like nitrogen, argon or arsenic, this etching is implemented for example at a temperature which is less than around 600° C., e.g. equal to around 550° C., and with a partial pressure of 30000 Pa (which may be between around 100 Pa and $10^5$ Pa) in order to have a re-crystallization speed which is lower than the etching speed (this re-crystallization corresponds to the amorphous semiconductor 131, 132 which become again crystalline). When the implantation creates an alloy composed of the semiconductor and of the implanted species (for example germanium or carbon), the temperature of the etching step may be greater than 600° C. because the re-crystallization of portions 131, 132 has no impact on the etching (even if the portions 131, 132 become again crystalline, the chemical composition of the portions 131, 132 remains different than that of the layer 102). It is possible to etch portions 131 and 132 because the crystallographic and/or chemical properties of portions 131 and 132 are different than the crystallographic and/or chemical properties of the non-implanted semiconductor of the layer 104. The previous step of implantation enables to obtain an etching selectivity between implanted portions 131, 132 and the non-implanted semiconductor of the layer 104. For example, the etching of amorphous silicon is around 100 times larger than the etching of monocrystalline silicon when HCl is used as etching agent. A small part of non-implanted semiconductor of the layer 104 may however be etched, as represented in FIG. 14B. However, in this case, the etched part does not reach the region located under the active region.

For example, it is possible to implant argon in monocrystalline silicon with energy equal to around 8 keV, a dose equal to around $5 \cdot 10^{15}$ cm$^{-2}$, and a tilt angle equal to around 15°. An etching with HCl at a temperature equal to around 590° C. enables to remove between around 5 nm and 10 nm of silicon under the future active region.

The making of the isolation trench is then achieved with the filling of the trench 128 with a dielectric material 122, e.g. SiO$_2$. The portions of dielectric material which are found deposited outside of the trench are etched by performing a CMP for example, the dielectric layer 126 serving as a stop layer during the planarization. This filling forms the dielectric portions 118 symbolically shown in FIG. 15A (symbolically because there is no physical difference or bound between the dielectric material of the portions 118 and the rest of dielectric material 122).

An annealing of the obtained isolation trench is then carried out, for example at a temperature equal to around 1050° C. and during around 30 minutes.

The layers 124 and 126 are then removed in order to reveal the thin layer of semiconductor 108. The various components of the transistor 100 are then made from the thin layer of semiconductor 108 (gate dielectric, gate, creation of source and drain regions, etc . . . ).

Figure 16:
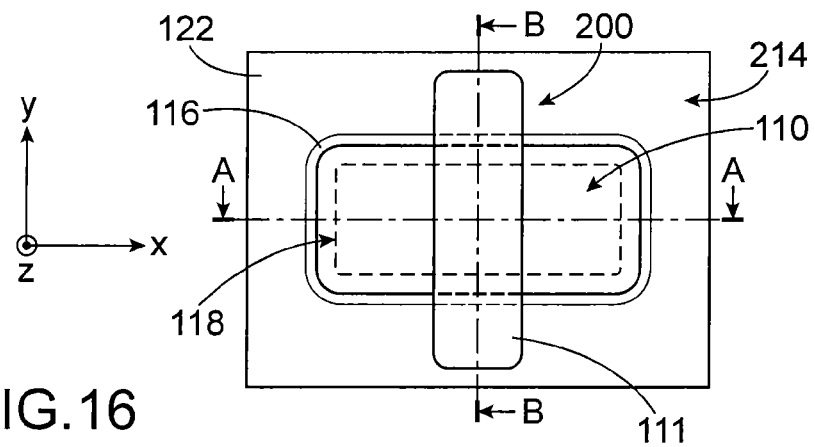
FIGS. 16 to 18 show a microelectronic device produced with a method according to a second embodiment of the invention.
Figure 17:
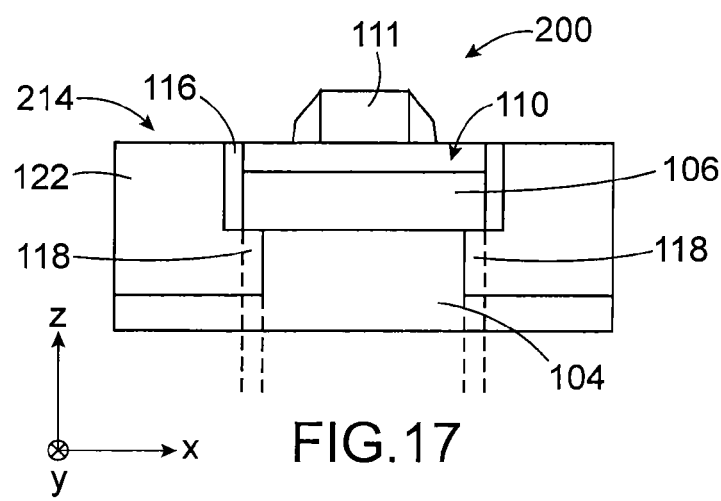
Figure 18:
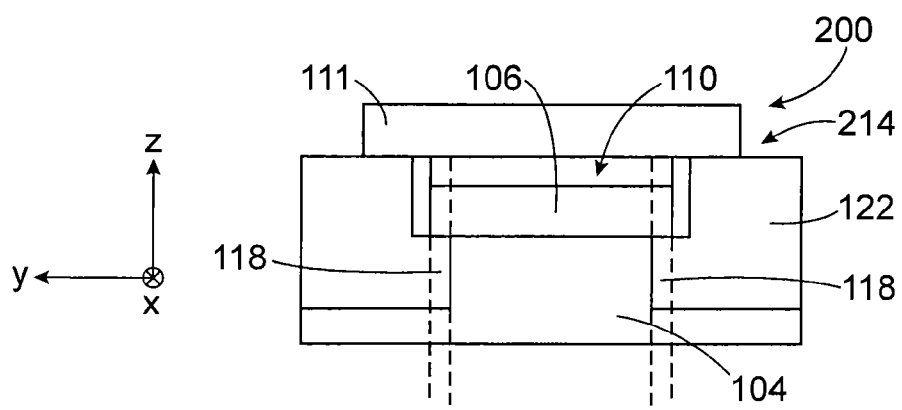

FIGS. 16 to 18 show schematically a microelectronic device 200, here a FDSOI transistor of the UTBB type, according to a second embodiment. FIG. 16 is a top view of the transistor 200, FIGS. 17 and 18 are cross-sectional views respectively along lines AA and BB shown in FIG. 16.

Compared to the previously described device 100 in which only two of the four side walls of the isolation trench 114 extend under the active region 110, the four side walls of the isolation trench 214 of device 200 all extend under the active region 110. The dielectric portions 118 are therefore present in the entire periphery of the active region 110.

Such isolation trench 214 is achieved via a ionic implantation (according to the first or the second variant as disclosed previously) of all side walls of the trench at the level of the thick semiconductor layer 104, for example analogously to the achievement of the portions 118 of transistor 100 described above. The dielectric portions 118 are in contact with the part of the dielectric layer 106 located under the active regions 110.

The invention claimed is:

1. A method of producing a microelectronic device in a substrate comprising a first semiconductor layer disposed on a dielectric layer, the dielectric layer being disposed on a second semiconductor layer, the method comprising:
    etching a trench through the first semiconductor layer, the dielectric layer and a part of the thickness of the second semiconductor layer such that another part of the thickness of the second semiconductor layer remains under a bottom wall of the trench, thus defining, in the first semiconductor layer, at least one active region of the microelectronic device;
    performing ionic implantation in one or more side walls of the trench, at a level of the second semiconductor layer, modifying the crystallographic properties, or the chemical properties, or both the crystallographic properties and the chemical properties, of the implanted second semiconductor layer in said side walls;
    etching the implanted second semiconductor layer such that at least a part of the trench extends under a part of the active region; and
    filling the trench with a dielectric material, forming an isolation trench surrounding the active region and comprising portions extending under the part of the active region.

2. The method according to claim 1, wherein the portions of the isolation trench that extend under the part of the active region are in contact with a portion of the dielectric layer disposed under the active region.

3. The method according to claim 1, wherein the semiconductor of the second semiconductor layer is crystalline, and the ionic implantation in said one or more side walls of the trench is such that the implanted second semiconductor layer becomes amorphous.

4. The method according to claim 1, wherein the ionic implantation in said one or more side walls of the trench is such that the implanted second semiconductor layer becomes a compound of said semiconductor and of an implanted ionic species.

5. The method according to claim 1, wherein the etching of the implanted second semiconductor layer is made using HCl as etching agent.

6. The method according to claim 1, wherein the ionic implantation is carried out with at least one ion beam having an energy of between about 0.5 keV and 40 keV, and/or a dose between about $5.10^{13}$ and $5.10^{16}$ at.cm$^{-2}$, and/or oriented such that an angle between said one or more side walls of the trench and the ion beam is between around 5° and 20°.

7. The method according to claim 1, wherein the ionic implantation is also performed in the bottom wall of the trench.

8. The method according to claim 1, further comprising, between the step of etching the trench and the step of ionic implantation, a step of producing at least one dielectric layer forming side walls of the isolation trench against the dielectric layer and the first semiconductor layer.

9. The method according to claim 1,
wherein the active region is substantially rectangular in shape and bounded by at least four side walls of the isolation trench extending through the first semiconductor layer, the dielectric layer and said part of the thickness of the second semiconductor layer, and
wherein, at the level of said part of the thickness of the second semiconductor layer, two of the four side walls which are substantially parallel with respect to each other extend under a part of the active region and the two other side walls do not extend under the active region.

10. The method according to claim 1,
wherein the active region is substantially rectangular in shape and bounded by side walls of the isolation trench extending through the first semiconductor layer, the dielectric layer and said part of the thickness of the second semiconductor layer, and
wherein, at the level of said part of the thickness of the second semiconductor layer, the side walls extend under a part of the active region.

11. The method according to claim 9, further comprising, after the step of filling of the trench, a step of producing at least one transistor in the active region, the transistor comprising a gate made on a part of the active region and on a part of said two other side walls.

12. The method according to claim 1, further comprising, after the step of filling of the trench, a step of producing at least one transistor in the active region, the transistor comprising a gate made on a part of the active region.

* * * * *

UNITED STATES PATENT AND TRADEMARK OFFICE
CERTIFICATE OF CORRECTION

PATENT NO. : 9,437,474 B2
APPLICATION NO. : 14/425891
DATED : September 6, 2016
INVENTOR(S) : Laurent Grenouillet et al.

It is certified that error appears in the above-identified patent and that said Letters Patent is hereby corrected as shown below:

On the Title Page

Item (73), the Assignee's information is incorrect. Item (73) should read:
-- (73) Assignee: **Commissariat à l'énergie atomique et
 aux énergies alternatives**, Paris (FR) --

Signed and Sealed this
Twenty-eighth Day of November, 2017

Joseph Matal
*Performing the Functions and Duties of the
Under Secretary of Commerce for Intellectual Property and
Director of the United States Patent and Trademark Office*